United States Patent
Vromans et al.

(10) Patent No.: US 7,999,587 B2
(45) Date of Patent: Aug. 16, 2011

(54) ENHANCED PREDISTORTION FOR SLEWING CORRECTION

(75) Inventors: Jan S. Vromans, Maastricht (NL); Jan C. A. Dekkers, Breda (NL); Gerben W. De Jong, Veldhoven (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 12/448,827

(22) PCT Filed: Jan. 4, 2008

(86) PCT No.: PCT/IB2008/050017
§ 371 (c)(1), (2), (4) Date: Feb. 19, 2010

(87) PCT Pub. No.: WO2008/084419
PCT Pub. Date: Jul. 17, 2008

(65) Prior Publication Data
US 2010/0148834 A1     Jun. 17, 2010

(30) Foreign Application Priority Data
Jan. 9, 2007 (EP) .................................. 07100266

(51) Int. Cl.
*H03K 5/12* (2006.01)

(52) U.S. Cl. ........................................ 327/170; 327/357

(58) Field of Classification Search ................. None
See application file for complete search history.

(56) References Cited

U.S. PATENT DOCUMENTS

| 4,509,017 A | 4/1985 | Andren et al. |
| 5,617,058 A | 4/1997 | Adrian et al. |
| 2009/0180527 A1* | 7/2009 | Asami ........................... 375/226 |

FOREIGN PATENT DOCUMENTS
EP    1 271 870 A    1/2003

OTHER PUBLICATIONS

International Search Report dated Jul. 15, 2008 in connection with PCT Application No. PCT/IB2008/050017.
Shawn Kuo, "Linearization of a Pulse Width Modulated Power Amplifier", Jun. 2004, MIT, 68 pages.

* cited by examiner

*Primary Examiner* — An T Luu

(57) ABSTRACT

The present invention relates to a circuit arrangement and method of applying predistortion to a baseband signal used for modulating a pulse-shaped signal, wherein an envelope information of the baseband signal is detected and slewing distortions of the pulse-shaped signal are reduced by applying at least one of a phase modulation and a duty cycle 5 modulation to the baseband signal as additional predistortion in response to the detected envelope information. Thereby, slewing distortions in the pulse-shaped signal are removed or at least reduced.

9 Claims, 4 Drawing Sheets

ENHANCED PREDISTORTION FOR SLEWING CORRECTION

CROSS-REFERENCE TO RELATED APPLICATION(S)

The present application claims priority under 35 U.S.C. §365 to International Patent Application No. PCT/IB2008/050017 filed Jan, 4, 2008, entitled "ENHANCED PREDISTORTION FOR SLEWING CORRECTION." International Patent Application No. PCT/IB2008/050017 claims priority to European Patent Application No. 07100266.1 filed Jan, 9, 2007. Both of these applications are incorporated by reference into the present disclosure as if fully set forth herein.

FIELD OF THE INVENTION

The present invention relates to a circuit arrangement, method, and computer program product for applying predistortion to a baseband signal which may be used as a modulating signal for a pulse modulator.

BACKGROUND OF THE INVENTION

Normal baseband signals have an amplitude $A(t)$ and a phase variation $\Phi_P(t)$. For transmission there may be a need for an radio frequency (RF) carrier which contains a desired baseband information, i.e., $s(t)=\mathrm{Re}(A(t)e^{j\Phi_P(t)}e^{j\omega t})$. Thus, an upconverter is needed. For transmission, high power levels are needed, and to improve efficiency of the power amplifier (PA) switching PA concepts may be applied (e.g., class D). An important key problem for power amplifiers (PAs) is their efficiency. For this reason new concepts based on polar modulation, synchronous and asynchronous sigma-delta and combined pulse width and pulse phase modulation (PWM-PPM modulation) are of interest. Two-level or binary signals are very suitable in combination with switching PA's. For PWM-PPM modulation and high frequencies new modulators types have been proposed. In such modulators, the predistorted modulating signal can be directly modulated on the first harmonic of the PWM-PPM modulated signal. However, the PWM-PPM-based modulation methods mentioned above are in general sensitive to slewing distortions and especially in case of small duty cycles of the binary baseband signal. The pulse-shaping will change from a trapezium waveform (large duty cycle) of constant amplitude into a triangle waveform of varying amplitude for small duty cycles. This results in amplitude and phase distortions of the modulating signal at the radio frequency (RF) carrier of the PWM-PPM signal. In former ideas PWM & PPM modulator concepts have been proposed, which were suitable for these switching PA-concepts. In practice however and specially for RF high power levels, slewing will result in a performance degradation (distortion) of these PWM modulated signals.

SUMMARY OF THE INVENTION

An object of the present invention is to provide an improved method and circuit arrangement, by means of which slewing distortions can be reduced.

The invention is defined by the independent claims. Dependent claims define advantageous embodiments.

Accordingly, slewing correction is achieved by applying (additional) predistortion to the baseband input signal. As a parameter for this slewing predistortion, an information about the envelope of the baseband signal is used. This envelope information thus determines the pulse width of the pulse-shaped signal and also the predistortion to be applied to the baseband signal, so that slewing distortions in the pulse-shaped signal can be removed or at least reduced. The envelope information may be determined based on a normalized envelope of the baseband signal. In a specific example, the envelope information may be derived by calculating a level of a first harmonic of the normalized envelope of the baseband signal. The use of a normalized envelope ensures that the pulse-shaped signal is generated with the right duty cycle to, obtain a less distorted first harmonic of the RF fundamental of the pulse-shaped signal.

As an example, the duty cycle modulation or the phase modulation may be calculated based on the envelope information, wherein the calculation is changed when the envelope information exceeds a predetermined threshold value. Thereby, the fact that the waveform of the pulse-shaped signal changes from a trapezium into a triangle can be considered. In a particular example, the predetermined threshold value may be determined based on an amplitude and at least one slew rate value of the pulse-shaped signal.

As an additional option for the case that the pulse-shaped signal is an asymmetrical signal, a control loop may be provided for controlling at least one of a rising edge and a falling edge of the pulse-shaped signal to obtain a symmetrical slew of the pulse-shaped signal. In a specific example, this control loop may comprise a slope detector for measuring slopes of the at least one of said rising edge and said falling edge of the pulse-shaped signal, and a slew rate correction unit for controlling the slew rate of at least one of the rising edge and the falling edge of the pulse-shaped signal to obtain a substantially symmetrical slewing of the pulse-shaped signal.

In an embodiment, the baseband signal may be applied as a modulating signal to a pulse modulation circuit, which generates said pulse-shaped signal.

The circuit arrangement may be implemented by using discrete hardware components or circuits, or, alternatively, by using a processor or computer device which is controlled by software routines so as to perform the above the claimed method steps. Consequently, the present invention may be implemented as a computer program product comprising code means for performing the claimed method steps when run on a computer or processor device.

BRIEF DESCRIPTION OF THE DRAWINGS

In the following, the present invention will be described in greater detail based on embodiments with reference to the accompanying drawings in which.

DESCRIPTION OF THE EMBODIMENT

The embodiments of the present invention will now be described in greater detail based on a predistortion concept for a PWM-PPM modulator circuit. Before starting with the description of the embodiments, underlying principles will be briefly discussed.

A complex baseband signal in cartesian format can be described as follows:

$$S_{baseband}(t) = I(t) + jQ(t) \tag{1}$$

The phase and the normalized envelope of this signal are then given by:

$$\Phi_P() = \arctan\left(\frac{Q(t)}{I(t)}\right) = \arg(s_{baseband}(t)) \tag{2}$$

$$A_{env}(t) = \frac{\sqrt{I(t)^2 + Q(t)^2}}{I_{max}^2 + Q_{max}^2}$$

In the embodiments, the normalized envelope of the baseband signal $A_{env}(t)$ is used to generate a PWM signal with the right duty cycle, which will result in a distortion free AM-modulation on the first harmonic of the RF fundamental of the PWM signal. The relation between the duty cycle and the envelope for quasi-stationary conditions is calculated below.

Figure 5:
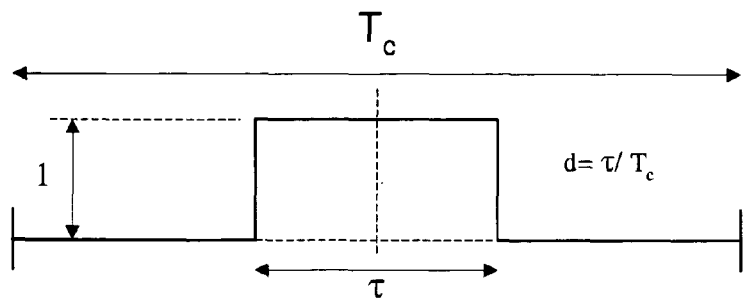
FIG. 5 shows a schematic pulse waveform with characteristic parameters.

FIG. 5 shows a schematic pulse waveform or pulse train with characteristic parameters, such as pulse width $\tau$ and pulse period $T_c$.

The Fourier series of the pulsetrain shown in FIG. 5 is obtain as follows:

$$f(t) = d \cdot h + \frac{2 \cdot h}{\pi} \sum_{n=1}^{\infty} \frac{\sin(n \cdot d\pi)}{n} \cos(n\omega_c t) \tag{3}$$

where the duty cycle d is defined as:

$$d = \frac{\tau}{T_C} \tag{4}$$

The equation (3) shows the relation between the amplitude of the fundamental frequency and its harmonics and the duty cycle. The relation between the $n^{th}$ harmonic of the pulse train and the duty cycle d can be described by the following equations:

$$A_n = \frac{2}{\pi} \frac{\sin(n \cdot d\pi)}{n} \tag{5}$$

$$d = \frac{1}{n\pi} \arcsin\left(\frac{n\pi \cdot A_n}{2}\right)$$

The normalized envelope $A_{env}$ of the baseband signal is used to generate a PWM signal with the right duty cycle given by equation (5), which will result in a desired level of the $n^{th}$ harmonic of the pulse width modulated signal. The relation between the normalized envelope $A_{env}$ and the duty cycle d for modulation of the first harmonic is:

$$d = \frac{1}{\pi} \arcsin(A_{env}) \tag{6}$$

Equation (6) shows that the duty cycle d will become 0.5 when the envelope $A_{env}$ has its maximum value of "1".

In practice, however, and especially for RF high power levels the PWM signal will suffer from slewing with the result of unwanted distortions. Such slewing distortions may appear when the signal has passed limiter or gating circuits, because at this point in the signal processing chain the signal will have its largest bandwidth and signal level.

Figure 6:
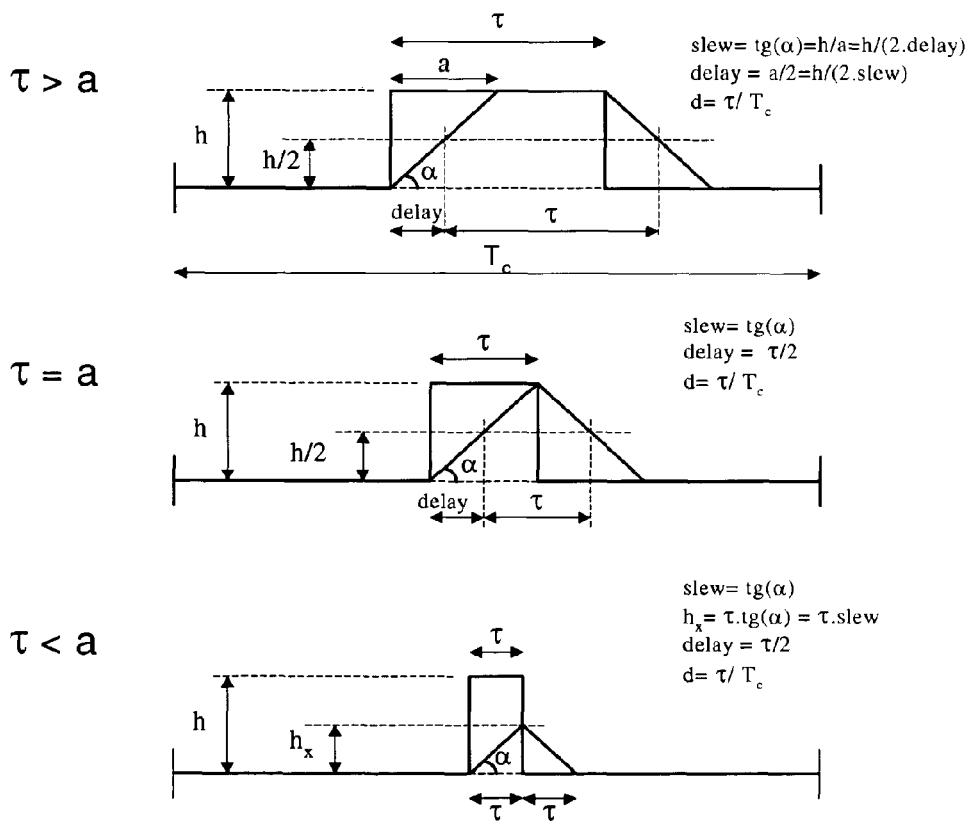
FIG. 6 shows schematic pulse waveforms indicating the influence of a symmetrical slewing on a pulse-shaped signal.

FIG. 6 shows the influence of a symmetrical slewing on a pulse-modulated or pulse-shaped signal. For $\tau \geq a$ the original rectangle pulses are changed into trapezium-shaped pulses with the same amplitude h but with a delay of a/2. For $\tau < a$ the original rectangle pulses are changed into triangle-shaped pulses of variable amplitude $h_x$ and a delay $\tau$. The pulse shaping thus depends on the pulse width $\tau$, which means that also the spectral components will be changed as a function of the delay $\tau$. The definitions for the duty cycle d and the slew rate slew are the same for all waveforms in FIG. 6 the same and given by:

$$d = \frac{\tau}{T_C} \tag{7}$$

$$\text{slew} = \tan(\alpha)$$

For $\tau \geq a$ the following relations can be derived:

$$\text{delay} = \frac{a}{2} = \frac{h}{2 \cdot \text{slew}} \quad (\text{for } \tau \geq a) \tag{8}$$

For $\tau < a$ the following relations are valid:

$$\text{delay} = \frac{\tau}{2} \quad (\text{for } \tau < a) \tag{9}$$

$$h_x = \tau \cdot \tan(\alpha) = \tau \cdot \text{slew} \quad (\text{for } \tau < a)$$

In the case of a trapezium waveform, the amplitude of the $n^{th}$ harmonic can be expressed as:

$$A_{n,trap} = 2 \cdot h \cdot d \cdot \text{Sinc}(n\pi d) \text{Sinc}\left(\frac{n \cdot \pi \cdot h}{T_C \cdot \text{slew}}\right) \tag{10}$$

For an amplitude change of the $n^{th}$ harmonic component of the trapezium waveform the duty cycle d has to change according the following relation:

$$d = \frac{1}{n \cdot \pi} \cdot \arcsin\left(\frac{A_{n,trap} \cdot n \cdot \pi}{2 \cdot h} \text{Sinc}^{-1}\left(\frac{n \cdot \pi \cdot h}{T_C \cdot \text{slew}}\right)\right) \tag{11}$$

The delay of the trapezium-shaped waveform will then become:

$$\text{delay}_{tray} = \frac{h}{2 \cdot \text{slew}} \tag{12}$$

Which results in the following distorting phase shift for the $n^{th}$ harmonic of the trapezium waveform:

$$\varphi_{n,trap} = n \cdot \omega_C \cdot delay_{trap} = \frac{n \cdot \pi \cdot h}{T_C \cdot \text{slew}} \quad (13)$$

On the other hand, the amplitude of the $n^{th}$ harmonic of the triangle waveform can be expressed as:

$$A_{n,\Delta} = 2 \cdot \tau \cdot \text{slew} \cdot d \cdot \text{Sinc}(n\pi d)^2 \quad (14)$$

For small duty cycles d which is the case here, the above equation (14) can be approximated for the fundamental (n=1):

$$A_{1,\Delta} \approx 2 \cdot \tau \cdot \text{slew} \cdot d = 2 \cdot T_c \cdot \text{slew} \cdot d^2 \quad (15)$$

Which results in a duty cycle:

$$d \approx \sqrt{\frac{A_{1,\Delta}}{2 \cdot T_C \cdot \text{slew}}} \quad (16)$$

The delay of the triangle shaped waveform is:

$$delay_\Delta = \frac{\tau}{2} = \frac{T_C \cdot d}{2} \quad (17)$$

This leads to the following distorting phase shift for the $n^{th}$ harmonic of the triangle waveform.

$$\varphi_{n\Delta} = n \cdot \omega_C \cdot delay_\Delta = n \cdot \pi \cdot d \quad (18)$$

At the threshold value where the shape of the waveform changes from a trapezium waveform into a triangle waveform, the amplitude of the first harmonic is given by:

$$A_{thresh} = \frac{2}{\pi^2} \cdot T_C \cdot \text{slew} \cdot \sin^2\left(\frac{\pi \cdot h}{T_C \cdot \text{slew}}\right) \quad (19)$$

Assuming that the envelope of the baseband signal will be modulated at the first harmonic of the pulse width modulated signal (largest carrier), the complete algorithm needed to combat the above distortions caused by stewing can be derived as follows.

The normalized envelope of the baseband signal is given by:

$$A_{env}(t) = \frac{\sqrt{I(t)^2 + Q(t)^2}}{\sqrt{\hat{I}^2 + \hat{Q}^2}} \quad \text{range } A_{env}: 0 \ldots 1 \quad (20)$$

The level range of the first harmonic is:

$$A_1(t) = \frac{2 \cdot h}{\pi} A_{env}(t) \quad \text{range } A_1: 0 \ldots \frac{2 \cdot h}{\pi} \quad (21)$$

The duty cycle modulation of the PWM modulator and the additional phase modulation for a distortion free AM modulation of the first harmonic is given by the conditional functions below, which depend on the level of the first harmonic in relation to the above threshold value of equation (19).

$$d(t) = \frac{1}{\pi} \cdot \arcsin\left(\frac{A_1(t)\pi}{2 \cdot h} \text{Sinc}^{-1}\left(\frac{\pi \cdot h}{T_C \cdot \text{slew}}\right)\right) \text{ if } A_1(t) \geq A_{thresh} \quad (22)$$

$$d(t) = \left|\sqrt{\frac{A_1(t)}{2 \cdot T_C \cdot \text{slew}}}\right| \text{ otherwise}$$

$$\psi(t) = \frac{\pi \cdot h}{T_C \cdot \text{slew}} \text{ if } A_1(t) \geq A_{thresh} \quad (23)$$

$$\psi(t) = \left|\pi\sqrt{\frac{A_1(t)}{2 \cdot T_C \cdot \text{slew}}}\right| \text{ otherwise}$$

The composite phase signal for the PWM-PPM modulation is build from the following parts:

Phase modulation PWM part:

$$\Phi_M(t) = (1 - 2d(t))\hat{\Phi}_M = (1 - 2d(t))\frac{\pi}{2} \quad (24)$$

Phase modulation PPM part:

$$\Phi_P(t) = \arg(S_{baseband}(t)) \quad (25)$$

Hence, the total phase modulation of the modulating baseband signal including signals to combat slewing distortion can be expressed as follows:

$$\theta_1(t) = \Phi_P(t) + \Phi_M(t) + \psi(t)$$

$$\theta_2(t) = \Phi_P(t) - \Phi_M(t) + \psi(t) \quad (26)$$

Thus, according to the embodiments, slewing distortions are removed or at least reduced by applying a first phase component to the baseband signal, which is determined by the desired duty cycle d(t) (and thus indirectly by the level $A_1(t)$ of the first harmonic of the baseband signal), and a second phase component which is directly determined by the level $A_1(t)$ of the first harmonic. Dependent on the applied PWM-PPM modulator type these phase components are used for the baseband signal generator.

Figure 1:
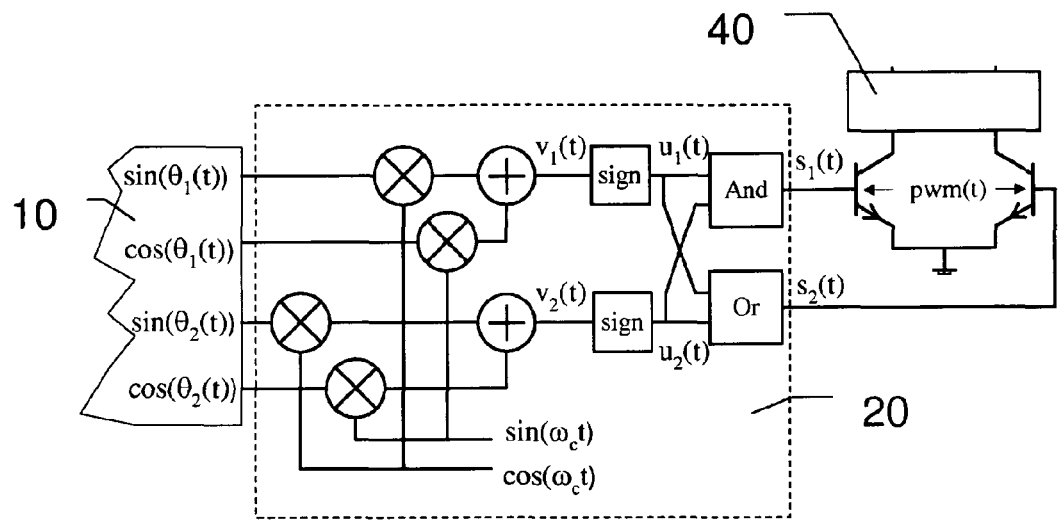
FIG. 1 shows a schematic circuit diagram of a circuit arrangement according to a first embodiment.

FIG. 1 show a schematic circuit diagram of a first embodiment which is based on a 4-multiplier modulator concept. According to this modulator concept, the following baseband components have to be generated:

$$\sin(\theta_1(t)), \cos(\theta_1(t)), \sin(\theta_2(t)), \cos(\theta_2(t)) \quad (27)$$

According to FIG. 1, these components of the baseband signal are generated in a digital baseband circuit 10, which may be a hard-wired digital signal processing circuit or a computer device controlled by respective software routines so as to generate the above components with the required phase values. The above components of the baseband signal are supplied to a PWM-PPM modulator circuit 20 which comprises four multipliers in order to multiplied the baseband components by two sine- and cosine-shaped RF carrier signals. The modulated sine and cosine components of the baseband signal are added in respective adder circuits to generate modulated RF components $v_1(t)$ and $v_2(t)$ which are binarized in respective sign circuits to generate corresponding binary signals $u_1(t)$ and $u_2(t)$ indicating their sign values. The modulated binary or pulse-shaped signals $u_1(t)$ and $u_2(t)$ are combined in an AND gate and an OR gate to generate modulator output signals $s_1(t)$ and $s_2(t)$ which are supplied to a differential input stage of a power amplifier (PA) 40. Thereby, a differential signal pwm(t) reflecting the above desired duty cycle modulation is applied to the differential input stage.

Figure 7:
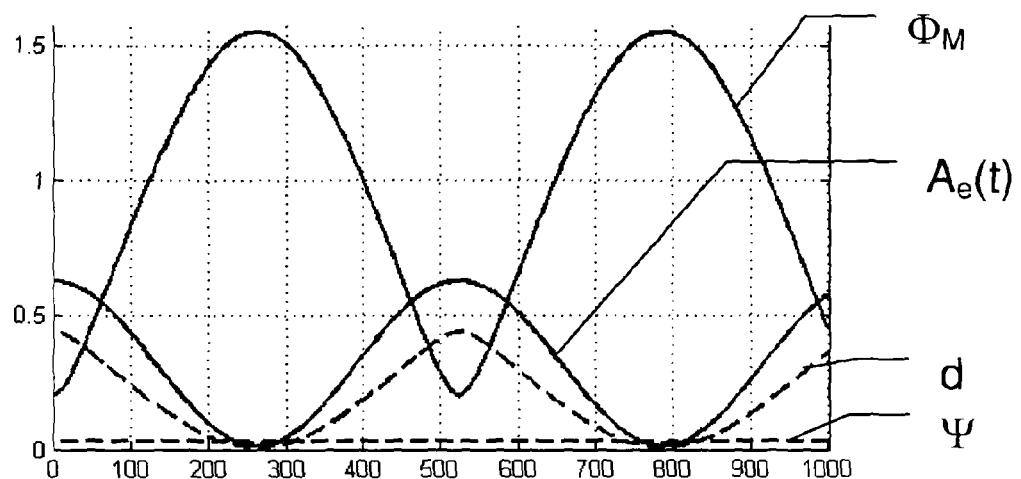
FIGS. 7 and 8 show time-dependent levels of different characteristic parameters for different slew rate values of the pulse-shaped signal.
Figure 8:
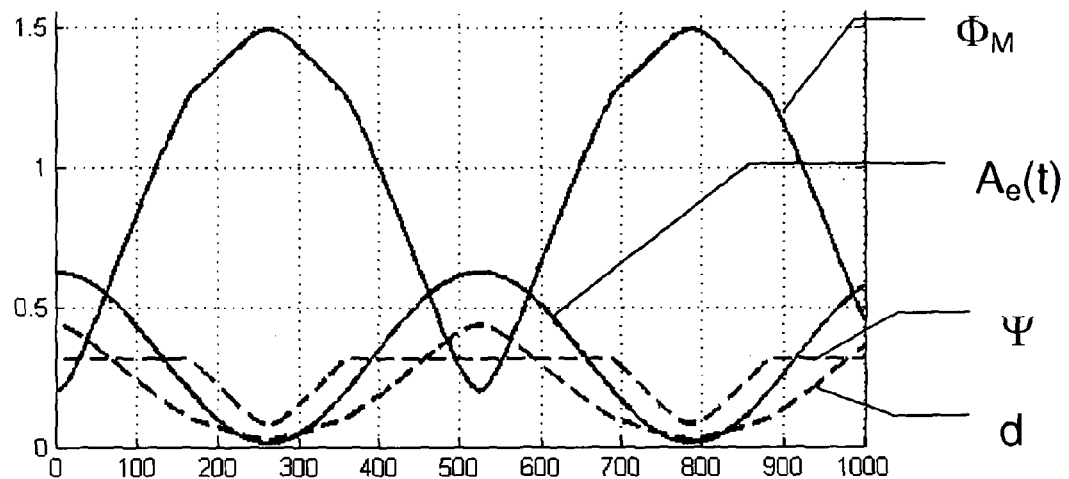

FIGS. 7 and 8 show simulation results with waveforms of different characteristic parameters for different slew rate values of the pulse-shaped signal. In particular, waveforms of the level of the scaled (factor $2/\pi$) envelope $A_e(t)$, the duty cycle $d(t)$, $\Phi_M(t)$ (phase modulation corresponding to the duty cycle) and the extra phase predistortion $\Psi(t)$ to compensate for the symmetric slewing are shown. The waveforms of FIG. 7 relate to a case with a pulse-modulated signal having little slew, while the waveforms of FIG. 8 relate to a case with more slew. If the slew is low, pulses with very small duty cycles remain high in their amplitude. In FIG. 7, the small constant value for $\Psi(t)$ originates from the delay of the trapezium waveform caused by the slew, which corresponds to the upper diagram of FIG. 6.

On the other hand, FIG. 8 shows simulation results for the same signal with a ten times lower slew rate value. In this case, high duty cycles lead to a large compensation phase $\Psi(t)$, which indicates a larger delay caused by the lower slew rate value. At the threshold value where the shape of the waveform changes from a trapezium into a triangular shape, a varying $\Psi(t)$ or delay can be observed. This behavior is fully described by the above equations.

However, the above-proposed (additional) predistortion to overcome intermodulation distortions caused by slewing is most effective in the case the pulse modulation (e.g., PWM-PPM-type modulation) has a symmetrical slew. For this reason there is a need for an additional control of the slewing symmetry of the pulse-shaped output signal.

Figure 2:
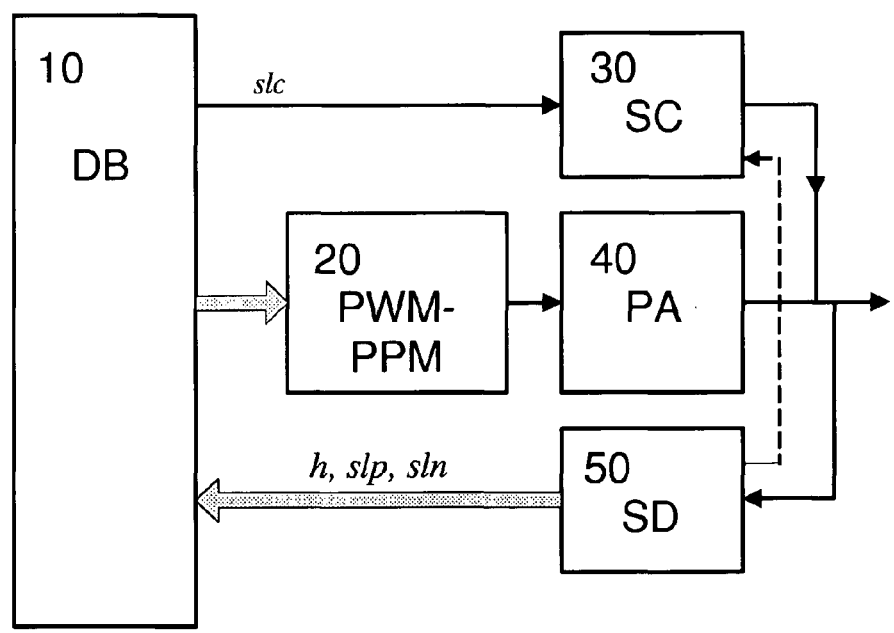
FIG. 2 shows a schematic block diagram of a circuit arrangement according to a second embodiment.

FIG. 2 shows a circuit arrangement according to a second embodiment which is based on the first embodiment, but comprises an additional control loop consisting of a slope detector block, unit, or circuit 50 and a slew rate correction block, unit, or circuit 30. The slope detector circuit 50 measures the slopes of the rising and falling edge of the output signal of the PA 40 separately. Measuring and controlling of the slope can be done, e.g., during a calibration cycle or during full operation. In calibration mode a signal with 50% duty cycle could be used, which enables simplified design of the slope detector unit 50.

The slope detector unit 50 may be arranged to generate three output signals, namely slp, sln, and h, wherein slp and sln indicate values of the slope of the rising and falling edges and h indicates an information about the amplitude level at the input of the slope detector unit 50. These output signals are passed via the digital baseband circuit 10, where a slew correction signal slc is generated and supplied to the slew rate correction circuit 30 to modify any possible asymmetrical slewing signal into a signal with has a symmetrical slew. This can be achieved by decreasing the slew rate of the edge with the highest slew rate until the slew rate is made symmetrical. Such a selective decrease can be achieved for example by suitably modifying the load at the output of the PA 40. It is however not necessary that the slew rate correction circuit 30 is controlled by the slew rate detection circuit 50 via the digital domain (i.e. the digital baseband circuit 10). As an alternative or modification, a direct control is also possible, as indicated by the dotted arrow in FIG. 2.

Figure 3:
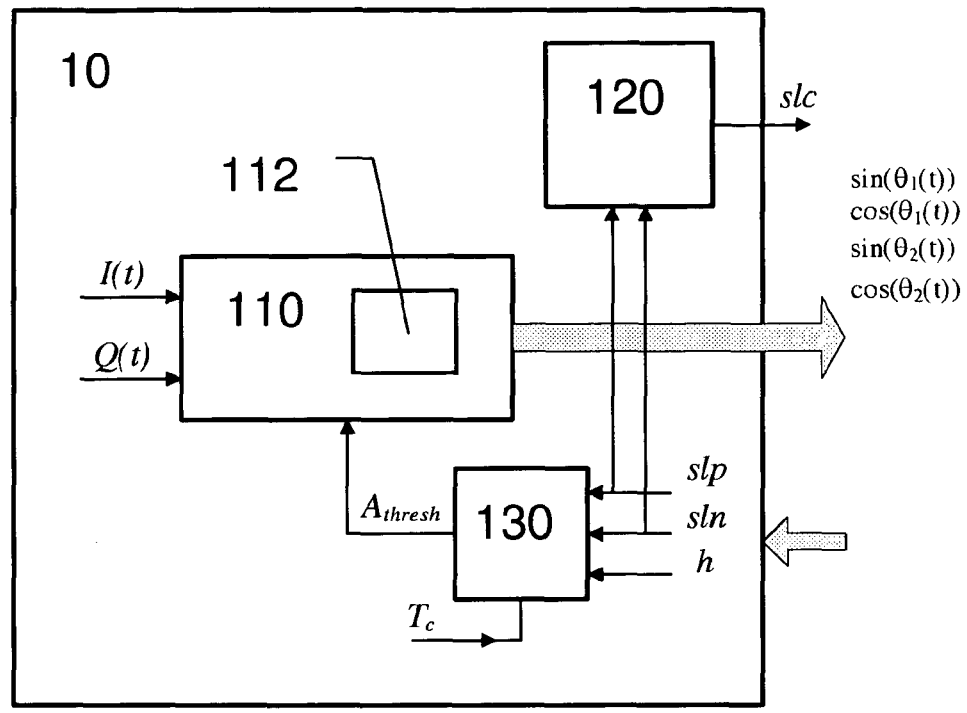
FIG. 3 shows a schematic block diagram of a digital baseband circuit provided in said first second embodiment.

FIG. 3 shows a schematic block diagram of an implementation example of the digital baseband circuit 10. Quadrature components I(t) and Q(t) of the baseband signal are supplied to a predistortion block, unit or circuit 110 which is arranged to calculate the above components $\sin(\theta_1(t))$, $\cos(\theta_1(t))$, $\sin(\theta_2(t))$, $\cos(\theta_2(t))$ in line with the equations (22) and (23) and to supply them to the PWM-PPM modulator 20 which is followed by the PA 40. Additionally, a threshold determination block, unit, or circuit 130 is provided which receives the amplitude value h, and the slew rate values slp and sln of the pulse-shaped (PPM-PWM) signal from the slew rate detection circuit 50 and determines or calculates a threshold value or signal $A_{thres}$ in the digital domain using the pulse period $T_c$. The threshold signal $A_{thres}$ is supplied to the predistortion circuit 110 which adapts the predistortion in dependence on this threshold signal $A_{thresh}$ and the envelope of the baseband signal, which envelope is determined from the quadrature components I(t) and Q(t) in an envelope detection block, unit, or circuit 112 which may or may not be part of the predistortion circuit 110. In addition thereto, a slew control block, unit, or circuit 120 may be provided if slew control is performed via the digital domain. The slew control circuit 120 calculates the amount of the slew correction value slc based on the positive and negative slew value slp and sln to obtain a PA output signal with a symmetrical slew.

Figure 4:
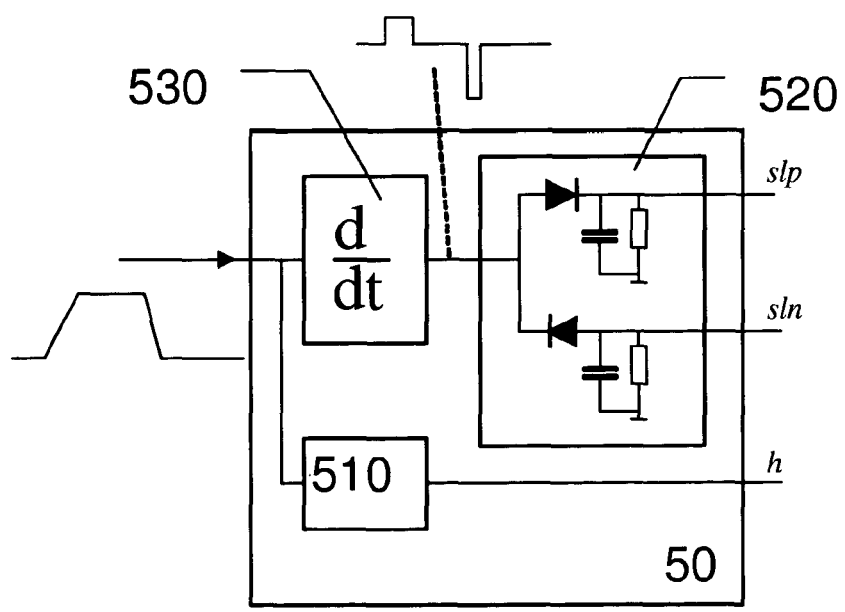
FIG. 4 shows a schematic block diagram of a slope detector provided in said second embodiment.

FIG. 4 shows an exemplary implementation of the slew rate detection circuit 50, wherein the steepness of the slopes is determined or measured by using a differentiating network 530, like for instance a simple RC network and two peak detectors 520 which generate the output signals slp and sln in accordance with the steepness of the respective slopes. Additionally, a further peak detector 510 may be provided for detecting the amplitude and thus the third output signal h. Thus, an additional predistortion in baseband is proposed for a distortion free pulse-modulated signal in case of symmetrical slewing. To achieve this, the amount of slewing can be determined. Asymmetrical slewing problems can be solved by modifying the signal into a signal with symmetrical slew, e.g., by means of slew rate reduction of the edge with the highest slew rate value. In a possible software-based implementation, the functionalities of the predistortion circuit 110, the envelope detection circuit 112, and the threshold determination circuit 130 of the digital baseband circuit 10 as well as the slew rate detection and correction circuits 50, 30 or at least a part thereof may be implemented by a processor or computer device with a control unit which performs control based on software routines of a control program stored in a memory. Program code instructions are fetched from the memory and loaded to the control unit of the processing unit in order to perform at least a part of the processing steps of the above functionalities. These processing steps are then configured to generate the control signaling required at the respective functionality.

In summary, a circuit arrangement and method of applying predistortion to a baseband signal used for modulating a pulse-shaped signal have been described, wherein an envelope information of the baseband signal is detected and slewing distortions of the pulse-shaped signal are reduced by applying at least one of a phase modulation and a duty cycle modulation to the baseband signal as additional predistortion in response to the detected envelope information. Thereby, stewing distortions in the pulse-shaped signal are removed or at least reduced.

The proposed circuit arrangement according to the first and second embodiment may be used in any application requiring pulse-modulated signals, such as modulated transmitters for wireless local area networks (WLAN), wireless area networks (WPAN), Bluetooth, orthogonal frequency division multiple network (OFDM), global system for mobile communication (GSM), universal mobile telecommunication system (UMTS), code division multiple access (CDMA), low-power mobile communication devices, and other suitable applications. In general, the present invention is not restricted to the above two embodiment and can be implemented in any connection with any processing of pulse-shaped signals so as to remove slewing distortions. Based on a detected envelope or amplitude information of the baseband signal at least one of the duty cycle or phase of the baseband signal is modulated or controlled to generate an additional predistortion for reducing stewing distortions. The above embodiments may thus vary within the scope of the attached claims.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A circuit arrangement for applying predistortion to a baseband signal applied as a modulation signal to a pulse modulation circuit which generates a pulse-shaped signal, said circuit arrangement comprising:
   a. a detection unit configured to determine envelope information of said baseband signal, said envelope information comprising baseband components $\sin(\theta_1(t))$, $\cos(\theta_1(t))$, $\sin(\theta_2(t))$, and $\cos(\theta_2(t))$ with $\theta_1(t)=\Phi_P(t)+\Phi_M(t)+\Psi(t)$ and $\theta_2(t)=\Phi_P(t)-\Phi_M(t)+\Psi(t)$, wherein $\Phi_P(t)$ is a phase of the baseband signal, $\Phi_M(t)$ corresponds to a duty cycle d(t), and $\Psi(t)$ is an extra phase predistortion to compensate for symmetric slewing; and
   b. a predistortion unit configured to supply the baseband components to the pulse modulation circuit which comprises four multipliers in order to multiply the baseband components by two sine- and cosine-shaped RF carrier signals, wherein at least one of the duty cycle and the phase of the baseband signal is modulated to generate additional predistortion for reducing slewing distortions in response to said determined envelope information.

2. The circuit arrangement according to claim 1, wherein said detection unit is arranged to determine said envelope information based on a normalized envelope of said baseband signal.

3. The circuit arrangement according to claim 2, wherein said detection unit is arranged to determine said envelope information by calculating a level of a first harmonic of said normalized envelope of said baseband signal.

4. The circuit arrangement according to claim 1, wherein said predistortion unit is arranged to calculate said modulation of said duty cycle or said phase based on said envelope information, and to change said calculation when said envelope information exceeds a predetermined threshold value.

5. The circuit arrangement according to claim 4, further comprising a threshold determination unit configured to determine said predetermined threshold value based on an amplitude and at least one slew rate value of said pulse-shaped signal.

6. The circuit arrangement according to claim 1, further comprising a control loop configured to control at least one of a rising edge and a falling edge of said pulse-shaped signal to obtain a symmetrical slew of said pulse-shaped signal.

7. The circuit arrangement according to claim 6, wherein said control loop comprises a slope detector configured to measure slopes of at least one of said rising edge and said falling edge of said pulse-shaped signal, and a slew rate correction unit configured to control the slew rate of at least one of said rising edge and said falling edge of said pulse-shaped signal to obtain a substantially symmetrical slewing of said pulse-shaped signal.

8. A method of applying predistortion to a baseband signal used for modulating a pulse-shaped signal, said method comprising:
   a. determining envelope information of said baseband signal, said envelope information comprising baseband components $\sin(\theta_1(t))$, $\cos(\theta_1(t))$, $\sin(\theta_2(t))$, and $\cos(\theta_2(t))$ with $\theta_1(t)=\Phi_P(t)+\Phi_M(t)+\Psi(t)$ and $\theta_2(t)=\Phi_P(t)-\Phi_M(t)+\Psi(t)$, wherein $\Phi_P(t)$ is a phase of the baseband signal, $\Phi_M(t)$ corresponds to a duty cycle d(t), and $\Psi(t)$ is an extra phase predistortion to compensate for symmetric slewing; and
   b. supplying the baseband components to a pulse modulation circuit which comprises four multipliers in order to multiply the baseband components by two sine- and cosine-shaped RF carrier signals, wherein at least one of the duty cycle and the phase of the baseband signal is modulated to generate additional predistortion for reducing slewing distortions in response to said determined envelope information.

9. The method according to claim 8, further comprising controlling at least one of a rising edge and a falling edge of said pulse-shaped signal to obtain a symmetrical slew of said pulse-shaped signal.

* * * * *